United States Patent [19]

Zarowin et al.

[11] Patent Number: 5,254,830
[45] Date of Patent: Oct. 19, 1993

[54] SYSTEM FOR REMOVING MATERIAL FROM SEMICONDUCTOR WAFERS USING A CONTAINED PLASMA

[75] Inventors: Charles Zarowin, Rowayton; L. D. Bollinger, Ridgefield, both of Conn.

[73] Assignee: Hughes Aircraft Company, Los Angeles, Calif.

[21] Appl. No.: 696,897

[22] Filed: May 7, 1991

[51] Int. Cl.$^5$ ............................................... B23K 9/00
[52] U.S. Cl. ......................... 219/121.43; 219/121.41; 219/121.59; 219/121.54; 156/646; 156/345; 204/298.32
[58] Field of Search ..................... 219/121.43, 121.41, 219/121.59, 121.54; 156/643, 646, 345; 204/298.31, 298.34, 298.32

[56] References Cited

U.S. PATENT DOCUMENTS

| | | | |
|---|---|---|---|
| 4,550,242 | 10/1985 | Uehara et al. | 219/121.43 |
| 4,713,259 | 12/1987 | Gartner et al. | 219/121.43 |
| 4,758,304 | 7/1988 | McNeil et al. | 156/643 |
| 4,816,638 | 3/1989 | Ukai et al. | 219/121.43 |

Primary Examiner—Mark H. Paschall
Attorney, Agent, or Firm—Michael W. Sales; Wanda K. Denson-Low

[57] ABSTRACT

A system for thinning wafers includes thickness measuring apparatus that provides information to a computer for generating a memory map of the wafer surface. The memory map is used to control a material removal apparatus that thins the wafer to a uniform thickness.

18 Claims, 3 Drawing Sheets

SYSTEM FOR REMOVING MATERIAL FROM SEMICONDUCTOR WAFERS USING A CONTAINED PLASMA

BACKGROUND OF THE INVENTION

The present invention generally relates to a system for removing material from a wafer and, in particular, relates to one such system including means for removing material from a wafer in accordance with a predetermined profile.

There are many instances, particularly in the semiconductor arts, where it is desirable to remove material in a controlled manner. Hence, although the following discussion relates to one type of semiconductor structure to which this system is particularly applicable it will be understood that this semiconductor application is not considered as being limiting.

Conventional semiconductor devices are most frequently fabricated in a layer of high resistivity semiconductor material, usually silicon, by such methods as diffusion, epitaxial layer growth, ion implantation or perhaps a combination of these techniques.

While this generalized configuration has served the semiconductor industry quite well for numerous years, it nonetheless has several drawbacks. For example, the small, but finite, conductivity of the high resistivity silicon creates charge leakage paths that limit the circuits that can be achieved. That is, devices operating under applied potentials of several hundred volts cannot be fabricated on the same device chip with devices operating at only a few volts.

In addition, the charge leakage paths also limit the circuits that can be achieved in both device density and bit storage lifetimes.

The proximity of the bulk silicon wafer to the active device layer results in a reduced radiation hardness. That is, for a memory device, exposure to high radiation can result in "bit errors". Whereas the thin active device layer is substantially transparent to incident radiation the much thicker underlying wafer absorbs a substantial amount of such radiation. This high absorption results in free electrical carriers that migrate to the active device layer and create logic and/or memory errors.

It has been long recognized by the industry that many of these problems could be completely eliminated or, at least, substantially reduced by forming the active device layer in a very thin layer of semiconductor that is supported by an insulator rather than the bulk silicon. Such a configuration is generally referred to as silicon-on-insulator (SOI).

Historically, SOI efforts have been directed to producing circuits in silicon-on-sapphire substrates. In general, the process would start with a single crystal sapphire wafer oriented such that the crystalline direction corresponding to the wafer surface represented the best possible lattice match to silicon. Then, a single crystal silicon film would be epitaxially grown on that surface. Nonetheless, in such a process there remains a substantial lattice mismatch between the sapphire and the silicon. Consequently, such devices generally exhibit relatively high defect densities. Further, silicon-on-sapphire wafers are brittle and comparatively quite expensive compared to the standard silicon wafers.

As a result, attempts have been made to produce silicon films on a silicon wafer, but with a layer of insulating material, i.e., silicon dioxide or silicon nitride, or the like, therebetween.

One of the earlier methods attempted is commonly referred to as zone-melt recrystallization (ZMR). In this technique a polycrystalline silicon film is deposited on a thermally oxidized silicon wafer surface, the film and wafer are then locally heated to reduce recrystallization of the silicon film. The resulting film is not a single crystal but, rather, consists of a large number of grains. Due to the large lattice mismatch between the silicon and the insulator the resulting film have substantially higher defect densities and rougher surfaces than typical high quality bulk silicon and thus exhibit poorer electrical properties.

A more recent development in the silicon-on-insulator field is referred to as the separation by implanted oxygen (SIMOX). In this technique a buried oxide layer is formed in a bulk silicon wafer by implanting oxygen ions to a depth of between 3000 Å to 4000 Å beneath the wafer surface. This results in a thin silicon layer above the oxide. The thin silicon layer is thus physically and electrically isolated from the bulk wafer. However, such wafers exhibit substantially higher impurity levels than bulk silicon which high impurity levels are quite disastrous for device performance. Further, the buried oxide layer typically contains numerous precipitates, resulting in lower breakdown voltage levels than for high quality thermal silicon dioxide layers. Still further, the cost of a finished SIMOX wafer is about 100 times more expensive than a conventional bulk wafer and about 10 times greater than a bonded silicon on insulator wafer.

Most recently SOI wafers have been formed by using two standard silicon wafers. One standard wafer is, typically, thermally oxidized to provide a silicon dioxide layer of about one micrometer on both surfaces thereof. The oxidized wafer is then bonded to a polished surface of the other standard silicon wafer. The bonded assembly is thereafter thinned by a series of mechanical grinding and chemo-mechanical polishing steps applied to its unbonded surface. The thinning process currently involves, in essence, standard mechanical grinding and polishing steps wherein material is removed from the wafer simultaneously for all surface points, i.e., full wafer abrasive removal with a polishing tool at least as large as the wafer itself. The process utilizes the interface between the back surface of the base wafer and the grinding/polishing lap as a reference for achieving a flat upper surface of the wafer into which devices will be formed. This process, thus, assumes that both the base wafer back surface and the lap are initially very flat and that there is not particulate contamination therebetween.

As it happens, such wafers exhibit several micrometer of peak-to-valley non-flatness across the surfaces. Further, it is extremely difficult to eliminate particulate contamination during thinning. Still further, whole wafer grinding and polishing processes are prone to an edge-roll off effect created by the deformation of the mechanical polishing tool under pressure as it traverses beyond the edge of the wafer being polished. In addition, the creation of an absolutely flat upper surface on the bonded wafer does not ensure a uniform thickness of the silicon film if there are any thickness variations in the underlying oxide or wafer bond. Finally, the use of full surface grinding and polishing techniques does not permit any useful control over the final thickness profile of the resultant thinned wafer.

Consequently, there is a substantial need for a system for removing material from wafers that overcomes the above-recited drawbacks of the current technology.

SUMMARY OF THE INVENTION

Accordingly, this object is accomplished, at least in part, by a system for removing material from a wafer that includes means for removing material from a wafer in accordance with a predetermined profile of that wafer.

Other objects and advantages will become apparent to those skilled in the art from the detailed description herein read in conjunction with the drawings attached hereto.

BRIEF DESCRIPTION OF THE DRAWING

The drawings, not drawn to scale, include.

DETAILED DESCRIPTION OF THE INVENTION

Figure 1:
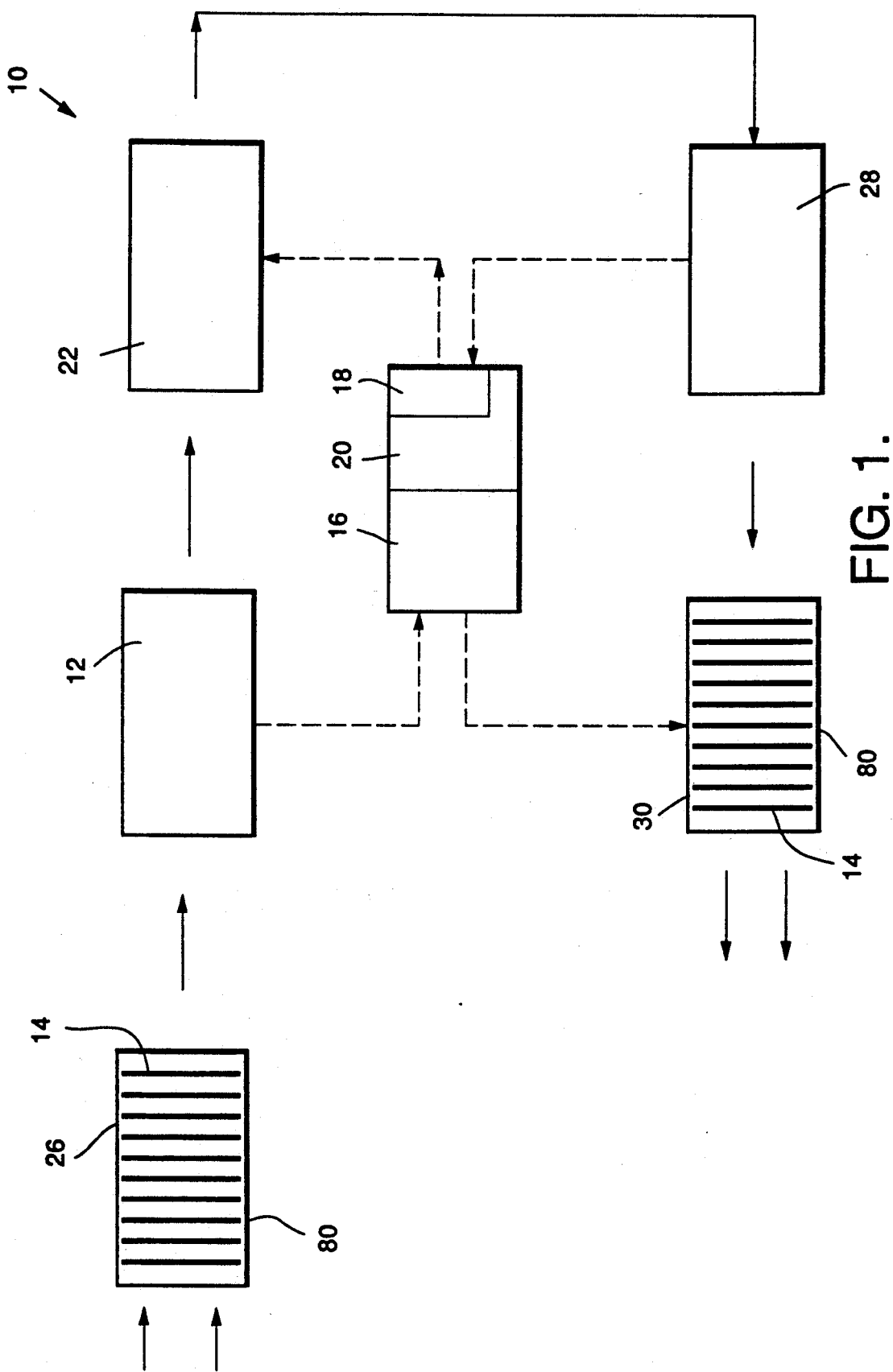
FIG. 1 which is a block diagram of a system for thinning wafers embodying the principles of the present invention.

A system, generally indicated at 10 in FIG. 1, for removing material from a semiconductor wafer includes means 12 for determining thickness profile data for a surface of a wafer 14, means 16 for converting the thickness profile data to a dwell time versus position map 18 stored in a system controller 20 and means 22 for removing material from a surface 24 of the wafer 14 in accordance with the map 18 such that the wafer 14 has a preselected thickness profile. It is understood that the term "wafer" as used herein includes, but is not limited to, a homogeneous wafer, a multi-layered wafer or a film on a substrate.

In one particular embodiment, the system 10 can also include means 26 for delivering one or more wafers 14 to the thickness profile data determining means 12, means 28 for determining thickness profile data of a wafer 14 subsequent to removing material therefrom, and means 30 for transporting one or more wafers 14 from the means 22 for removing material.

Figure 2B:
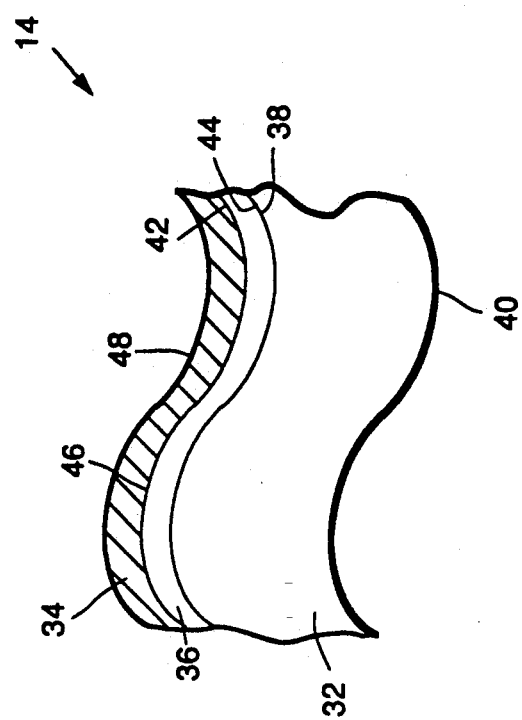
FIG. 2B which is another cross-sectional view of an exemplary wafer subsequent to being thinned by a system embodying the principles of the present invention.

The present system 10 is hereinafter discussed and described in consideration of the application of the system 10 to thinning silicon-on-insulator wafers. In one such embodiment, a typical wafer 14, shown in cross-section in FIG. 2, includes a silicon support substrate 32 having a silicon film 34 affixed thereto and spaced apart therefrom by a layer 36 of insulating material, such as, for example, silicon dioxide, silicon nitride, or the like. Bonded silicon wafers are available from a number of semiconductor wafer manufacturers.

Figure 2A:
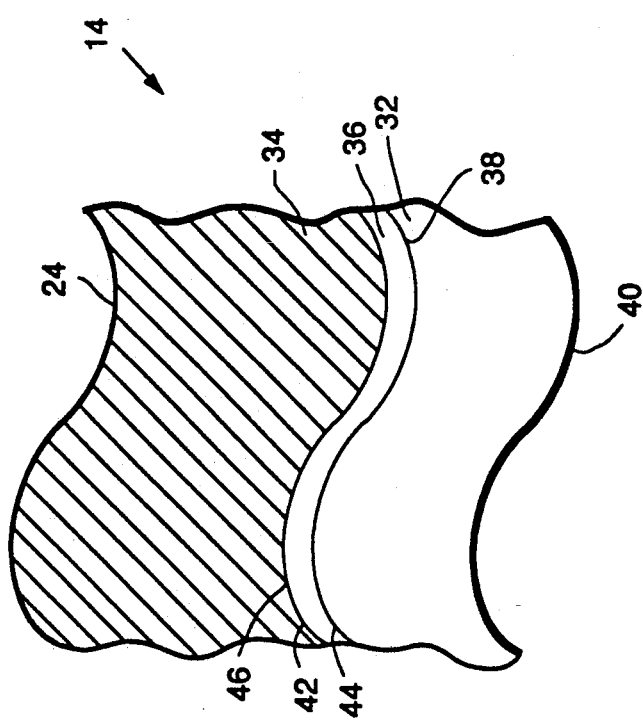
FIG. 2A which is a cross-sectional view of an exemplary wafer prior to being thinned by a system embodying the principles of the present invention.

As shown the surfaces, 38 and 40, of the support substrate 32, the surfaces, 42 and 44, of the insulator 36 and the lower surfaces 46 of the silicon film 34 are irregular, i.e., not flat. The upper surface 48 of the silicon 34 film is shown as being flat as it may appear subsequent to the application of conventional chemo-mechanical polishing techniques. Consequently, as shown in FIG. 2A, were the silicon film 34 thinned by only such techniques it is clear that the thickness profile of the silicon film 34 would not be uniform. Nevertheless, for the purposes of the present invention such gross conventional techniques may be used to initially remove material from the silicon film 34 to a general, but nonuniform, thickness on the order of about 5 micrometers.

Typically, the silicon film 34 is, initially, a silicon wafer having an average thickness of about 200 micrometers. Usually, the peak-to-valley distances are usually on the order of about 10 micrometers but can also be on the order of 50 micrometers. Hence, conventional chemo-mechanical polishing techniques can be used to reduce the thickness of the silicon film 34 to between about 3 micrometers and 5 micrometers without causing any single point of the film to be too thin to be useful.

The typical wafer 14 is then conveyed to the means 12 for determining thickness profile data of the silicon film 34. In one embodiment the means 12 is an interferometer that computes thickness at each point of the surface on a point-by-point basis from the white light interference patterns. The thickness profile data determining means 12 can alternatively be, for example, an ellipsometer, a high frequency acoustic wave device, or a full surface interferometer. Each has advantages and disadvantages as well as preferential applicability. One of the primary criteria for selecting the thickness profile data determining means 12 is that the operating wavelength thereof must be within the transparency range of the material of the film or wafer. For example, in the case of an SOI wafer, white light interferometry has advantage because many points can be rapidly measured to map the thickness profile data. In the case of, for example, the thinning of a charge-coupled device array application, laser transmission is advantageous because a free standing silicon film can be measured.

In any event, the thickness profile of the silicon film 34 is determined across the entire upper surface 48 thereof. This can be accomplished by translating the thickness profile measuring instrument and the wafer 14 with respect to each other. For example, an interferometric beam can be raster scanned across the wafer 14, or alternatively, the wafer 14, can be moved with respect to a stationary interferometric instrument.

The initial profile data representing the point-by-point thickness of the silicon film 34 is then processed by the converting means 16 to yield a dwell time versus position map 18 for the entire upper surface 48 of the silicon film 34. As more fully discussed with respect to FIG. 3, the preferred means 22 for material removal is a plasma etching puck having an etching footprint smaller than a representative dimension along the wafer surface thickness variation in the silicon film 34 to be removed. The input data to the converting means 16 includes at least three factors, the measured initial thickness profile data, the desired final film thickness profile data and the spatial material removal rate pattern of the plasma etching puck. In the event that the spatial material removal rate pattern is unknown for a particular film material, empirical measurements should be taken on that material prior to the formation of the dwell time versus position map. The measured initial film thickness profile data and the desired target film thickness profile provide a thickness error map of material thickness to be removed from the silicon film 34. Effectively, in one instance, the thickness error map is generated by a point-by-point subtraction of the desired end thickness from the measured initial thickness. In the specific application where a final uniform film thickness is desired the material thickness error map would be the initial film thickness profile less a constant. It will be recognized that, any arbitrary film thickness profile can be produced by specifying a material thickness error map constructed from the initial measured film thickness profile data and the target film profile data. In general, the converting means 16 can be the equivalent of the arithmetic logic unit of a personal computer including appropriate input, output, memory and other peripheral units. Similarly, the system controller 20 can be any of the typical computer controllers readily available for machine control operations.

The dwell time versus position map 18 is then computed from the thickness error map. The dwell time map represents the length of time that the plasma removal puck must spend at each specified position over the film surface 34 to produce the specified target film thickness profile. The dwell time map computation incorporates the spatial material removal rate of the plasma etching puck. In one embodiment, the dwell map is calculated using a known two-dimensional fast Fourier transfer implementation of the Fourier Deconvolution Theorem on the film thickness error map.

Finally, the dwell time map is used by the system controller 20 to generate a set of instructions to the translation mechanism of the apparatus. The instructions are used to control the velocity of the plasma puck over the silicon film 34 in a predetermined path so as to execute the dwell times versus position map 18 of the plasma puck and thus provide the target film thickness profile. In the embodiment shown in FIG. 3, the machine instructions control the motion of an x-y stage, discussed hereinafter with respect to FIG. 2 so that the wafer with the silicon film 34 is moved under the plasma puck.

Figure 3:
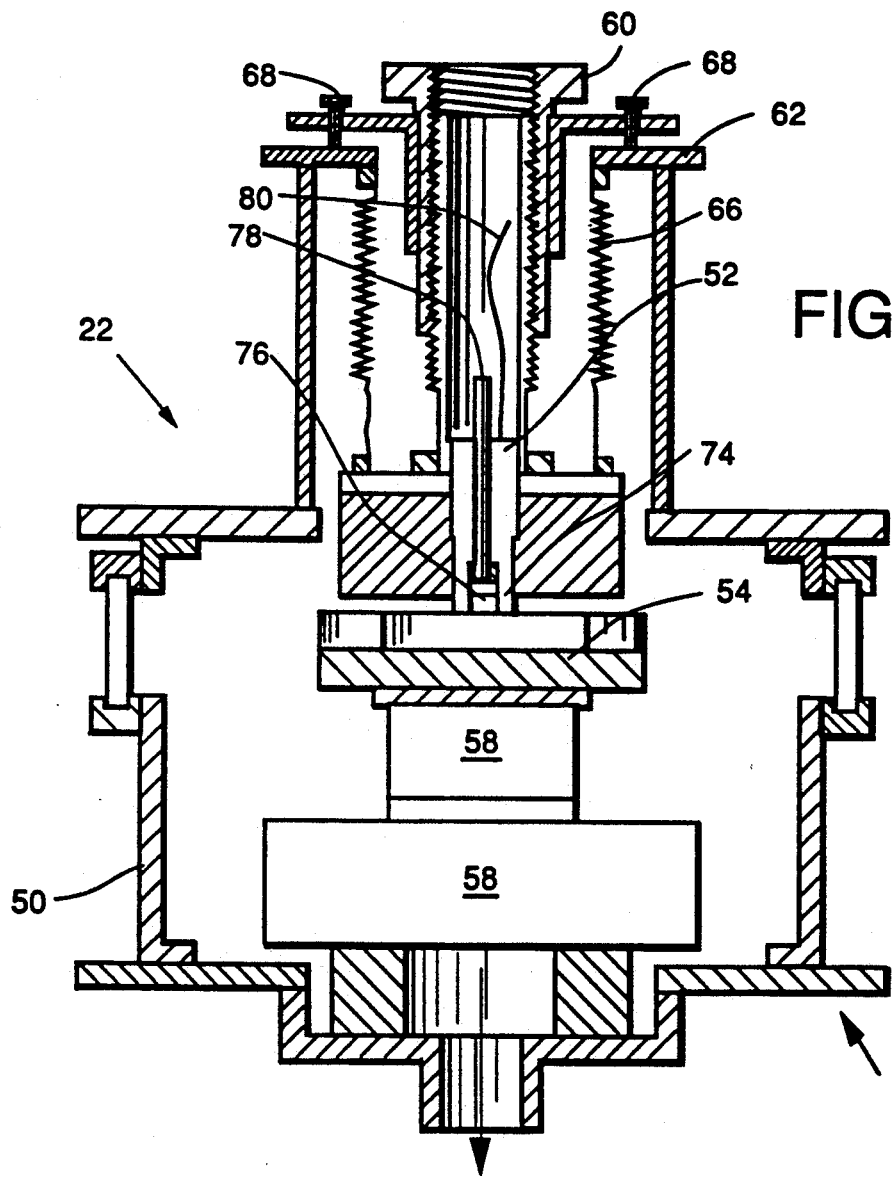
FIG. 3 which is a cross-sectional view of an apparatus for removing material.

In the preferred embodiment, the means 22 for removing material includes a plasma assisted chemical etching chamber as shown in FIG. 3. The basic operation of such a chamber is fully discussed and described in U.S. Pat. No. 4,668,366 issued to Charles B. Zarowin on May 26, 1987 and entitled Optical Figuring By Plasma Assisted Chemical Transport And Etching Apparatus Therefor. The principles and teachings of that patent are hereby incorporated herein by reference.

In one embodiment, shown in FIG. 3, the material removal means 22 includes a vacuum chamber 50 having a plasma source 52 disposed therein. The chamber 50 further includes in one embodiment, a wafer support 54 disposed on a table 56. Preferably, the temperature of the wafer support 54 can be controlled to avoid possible high temperature effects. The plasma source 52 and the table 56 are arranged such that relative motion can be controlled therebetween. In the chamber 50 shown in FIG. 3, the table 56 can be moved with respect to the source 52 by translation means 58 in two orthogonal directions, i.e., the x and y planes of the wafer 14. Such translation means 58 are known in the art and further detailed description thereof is not believed necessary. Further, the chamber 50 includes a port 59 via which a preselected vacuum can be established within the chamber 50.

In the embodiment shown, the wafer 14 to be thinned is positioned on the wafer support 54. Preferably, the plasma source 52 is essentially fixed although a height adjustment means 60 and a tilt adjustment means 62 are provided. In one embodiment the height adjustment means 60 includes providing the plasma source 52 with an externally threaded extension 64 that can be rotated to control the distance between the plasma source 52 and the wafer 14. The height adjustment means 60 is enclosed with a bellows 66 to ensure the integrity of the vacuum chamber 50.

The tilt adjustment means 62 includes a plurality of control screws 68 threaded through a flange 70 of a bracket 72 affixed to the extension 64 of the plasma source 52. The flange 70 is disposed external the vacuum chamber 50 such that the screws apply pressure against the vacuum chamber 50 to tilt the plasma source 52 with respect to the table 56.

Preferably, as shown in FIG. 3, the plasma source 52 includes a plasma containment member 74 having a recess 76 formed therein proximate the table 54. The recess 76 defining a plasma chamber. The member 74 further includes a plasma gas inlet opening 78 such that the feedgas for the plasma can be provided to the plasma chamber. Further, the member 74 includes RF energy supply means 80 to establish the plasma gas discharge across a pair of electrodes 82 within the plasma containment member 74.

The means 26 for delivering wafers 14 to the thickness profile data determining means 12 and the means 30 for transporting wafers 14 from the means 22 for removing material can include one or more wafer holders 80. In one embodiment, the wafer holders 80 are conventional semiconductor wafer cassettes and are delivered and removed using conventional automated cassette handling systems.

In the preferred embodiment, the means 28 for determining thickness profile data of a wafer 14 subsequent to the removal of material therefrom is the same type as that used for the means 12. It will be understood that, if desirable, the same measuring instrument can be used for the measurement of the wafer 14 both before and after material removal.

The system 10 described herein is advantageous in that the use of a plasma to effect material removal introduces negligible subsurface damage and is inherently self-smoothing. Consequently, subsequent lithographic processes commonly used in semiconductor device fabrication are enhanced. Further, the negligible subsurface damage and self-smoothing conditions can be maintained at substantial material removal rates. In fact, processes have been developed that are capable of vertical silicon removal rates in excess of 50 micrometers per minute.

Although the present invention has been discussed herein with respect to a particular embodiment it will be understood that other configurations and arrangements may be implemented by those skilled in the art which do not depart from the spirit and scope hereof. Hence, the present invention is deemed limited only by the claims appended hereto and the reasonable interpretation thereof.

What is claimed is:

1. A system for removing material from a semiconductor wafer; said system comprising:
   means for determining thickness profile data for said semiconductor wafer;
   means for generating a dwell time versus position map for said semiconductor wafer, said map being generated from said thickness profile data; and
   means for removing material from said semiconductor wafer, said material removing means being controlled in accordance with said dwell time versus position map, said means including a plasma chemical etching chamber having a platform for receiving said semiconductor wafer, a means for creating a contained plasma within said chamber, said contained plasma having an etching footprint smaller than the dimension of thickness variation to be removed, and a means for controlling the dwell time and position of said plasma in accordance with said dwell time versus position map.

2. The system as claimed in claim 1, wherein said thickness profile determining means includes an interferometer.

3. The system as claimed in claim 2, wherein said interferometer computes said thickness on a point-by-point basis.

4. The system as claimed in claim 1, wherein said thickness profile determining means includes an ellipsometer.

5. The system as claimed in claim 1, wherein said thickness profile determining means includes a full surface interferometer.

6. The system as claimed in claim 1, further comprising;
means for delivering one or more wafers to said thickness profile data determining means.

7. The system as claimed in claim 1, further comprising:
means for determining thickness profile data subsequent to said material removal.

8. The system as claimed in claim 1, further comprising:
means for transporting one or more wafers away from said material removal means.

9. The system as claimed in claim 2, wherein said wafer includes a a film on a surface thereof and said thickness profile data relates to said film thickness.

10. The system as claimed in claim 9, wherein said film is a layer of silicon.

11. The system as claimed in claim 10, wherein said layer of silicon is disposed over a layer of insulating material.

12. The system as claimed in claim 11 wherein said layer of insulating material is disposed over a silicon substrate, said silicon substrate and said silicon film being spaced apart by said layer of insulating material.

13. The system as claimed in claim 1 wherein said generating means includes means for subtracting said thickness profile data from preselected profile data such that said dwell time versus position map represents a surface having said preselected profile.

14. The system as claimed in claim 1 wherein said plasma chamber further includes:
means for tilting said wafer with respect to said plasma creating means; and
means for controlling the distance between said wafer and said plasma creating means.

15. The system as claimed in claim 1 wherein said controlling means includes means for moving said wafer with respect to said means for creating a plasma.

16. A system for thinning silicon-on-insulator semiconductor wafers, said system comprises:
means for determining thickness profile data for a silicon film overlying an insulator on said semiconductor wafer;
means for generating a dwell time versus position map for said silicon film, said map being generated from said thickness profile data; and
means for removing material from said film, said material removing means being controlled in accordance with said dwell time versus position map, said means including a plasma chemical etching chamber having a platform for receiving said semiconductor wafer, a means for creating a contained plasma within said chamber, said contained plasma having an etching footprint smaller than the dimension of thickness variation to be removed, and a means for controlling the dwell time and position of said plasma in accordance with said dwell time versus position map.

17. The system as claimed in claim 16 wherein said generating means includes means for subtracting said thickness profile data from preselected profile data such that said dwell time versus position map represents a surface having said preselected profile.

18. The system as claimed in claim 17 wherein said preselected profile data is a constant such that said silicon film is thinned to a uniform thickness with respect to said insulator.

* * * * *